United States Patent [19]
Shona

[11] Patent Number: 6,003,768
[45] Date of Patent: Dec. 21, 1999

[54] CALL-UNIT COUNT DEVICE

[75] Inventor: Yoshihiro Shona, Tokyo, Japan

[73] Assignee: Oki Electric Industry Co., Ltd., Tokyo, Japan

[21] Appl. No.: 08/814,469

[22] Filed: Mar. 10, 1997

[30] Foreign Application Priority Data

Jun. 28, 1996 [JP] Japan .................................. 8-169506

[51] Int. Cl.$^6$ .................................................. G06K 5/00
[52] U.S. Cl. ..................... 235/380; 235/375; 235/376; 235/379; 235/382
[58] Field of Search ..................... 235/380, 375, 235/376, 379, 382; 902/26

[56] References Cited

U.S. PATENT DOCUMENTS

| | | | |
|---|---|---|---|
| 4,530,108 | 7/1985 | Wilmsmeyer | 377/111 |
| 4,829,169 | 5/1989 | Watanabe | 235/492 |
| 4,853,526 | 8/1989 | Effing | 235/492 |
| 5,089,959 | 2/1992 | Hazard | 364/406 |
| 5,285,415 | 2/1994 | Depret et al. | 365/189.01 |

FOREIGN PATENT DOCUMENTS

| | | |
|---|---|---|
| 0 070 461 A2 | 1/1983 | European Pat. Off. . |
| 2 707 027 A1 | 12/1994 | France . |
| 58-24243 | 2/1983 | Japan . |
| 7-141478 | 6/1995 | Japan . |
| WO 88 00775 | 1/1988 | WIPO . |

*Primary Examiner*—Donald Hajec
*Assistant Examiner*—Douglas X. Rodriguez
*Attorney, Agent, or Firm*—Venable; Robert J. Frank; Jeffrey W. Gluck

[57] ABSTRACT

A call-unit count device according to the present invention comprises a memory circuit having a high-order level and a low-order level composed of n (n: integer greater than or equal to 2) bits and wherein all the bits each indicative of the initial value and placed in the low-order level are changed to reversed values bit by bit each time a one call-unit add command is given, all the bits in the low-order level, which have been brought to the reversed values, are returned to the initial value bit by bit each time the one call-unit add command is given, and values stored in the high-order level are changed upon a carry from the low-order level to the high-order level.

20 Claims, 9 Drawing Sheets

1 CALL UNIT

10 CALL UNITS

11 CALL UNITS

19 CALL UNITS

20 CALL UNITS

219 CALL UNITS

220 CALL UNITS

7999 CALL UNITS

8000 CALL UNITS

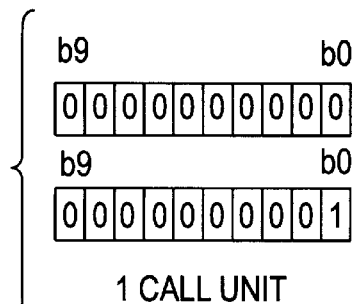
FIG. 4A — 1 CALL UNIT
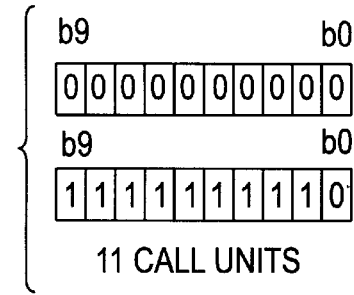
FIG. 4B — 11 CALL UNITS
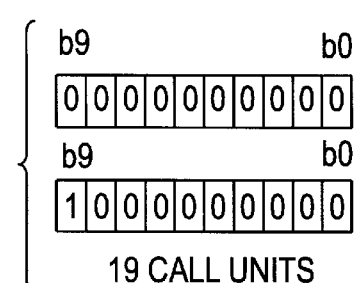
FIG. 4C — 19 CALL UNITS
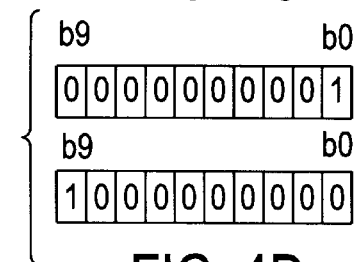
FIG. 4D
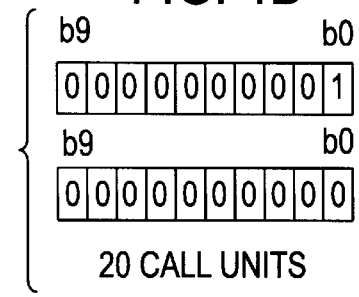
FIG. 4E — 20 CALL UNITS
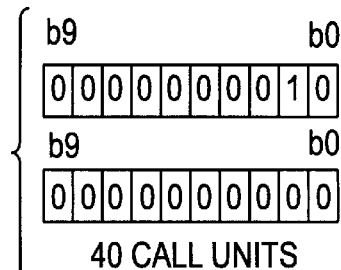
FIG. 4F — 40 CALL UNITS
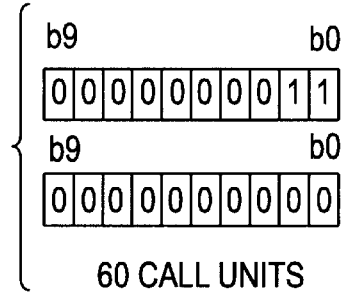
FIG. 4G — 60 CALL UNITS
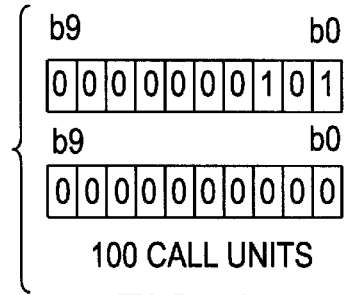
FIG. 4H — 100 CALL UNITS
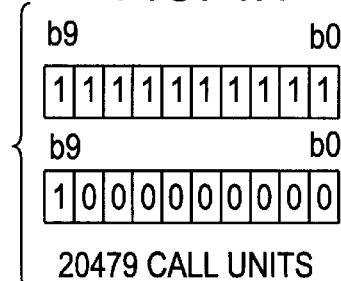
FIG. 4I — 20479 CALL UNITS
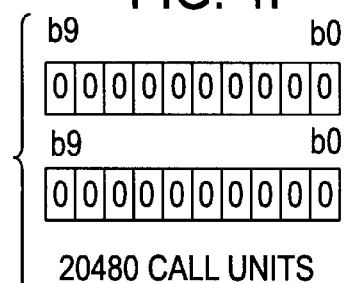
FIG. 4J — 20480 CALL UNITS

FIG. 6A

LEVEL 3: b9 [0000000000] b0
LEVEL 2: b9 [0000000000] b0
LEVEL 1: b9 [0000000001] b0

FLAG 2: [0]

1 CALL UNIT

FIG. 6B

LEVEL 3: b9 [0000000001] b0
LEVEL 2: b9 [0000000000] b0
LEVEL 1: b9 [0000000000] b0

FLAG 2: [1]

20 CALL UNITS

FIG. 6C

LEVEL 3: b9 [0000000001] b0
LEVEL 2: b9 [0000000010] b0
LEVEL 1: b9 [0000000000] b0

FLAG 2: [0]

40 CALL UNITS

| THE POINT OF THE CARD WITHDRAW | FLAG 1 | FLAG 2 | LEVEL 1 | LEVEL 2 | LEVEL 3 | |
|---|---|---|---|---|---|---|
| BEFORE THE CARRY | 0 | 0 | b9 [1000000000] b0 | b9 [0000000010] b0 | b9 [0000000001] b0 | 59 CALL UNITS |
| P1 | 1 | 0 | b9 [1000000000] b0 | b9 [0000000010] b0 | b9 [0000000001] b0 | |
| P2 | 1 | 0 | b9 [1000000000] b0 | b9 [0000000010] b0 | b9 [1111111111] b0 | |
| P3 | 1 | 0 | b9 [1000000000] b0 | b9 [0000000010] b0 | b9 [0000000011] b0 | |
| P4 | 1 | 0 | b9 [0000000000] b0 | b9 [0000000010] b0 | b9 [0000000011] b0 | |
| P5 | 1 | 1 | b9 [0000000000] b0 | b9 [0000000010] b0 | b9 [0000000011] b0 | |
| AFTER THE CARRY | 0 | 1 | b9 [0000000000] b0 | b9 [0000000010] b0 | b9 [0000000011] b0 | 60 CALL UNITS |

CALL-UNIT COUNT DEVICE

BACKGROUND OF THE INVENTION

1. Field of the Invention

This invention relates to a frequency or call-unit count device.

2. Description of the Related Art

This type of call-unit count device has heretofore been configured as a portable module such as an IC card having a memory circuit such as an Electrically Erasable Programmable Read Only Memory (hereinafter called EEPROM) or the like. When a command for adding a frequency or call unit (call-unit add command) is issued or given from a card reader, the call-unit count device adds the call unit given by the call-unit add command to call units (corresponding to the sum of call units which have been given up to now by the input call-unit add commands) stored in the EEPROM at this time, and stores the call units obtained by its addition therein.

Described specifically, the EEPROM is divided into a plurality of levels respectively composed of a plurality of bits. In this type of EEPROM, bits in the least significant level are set to "1" bit by bit each time a command for adding one frequency or call unit (hereinafter called "one call-unit add command") is given, for example. When all the bits in the least significant level are brought to "1", a bit in a level higher by one than the above level are brought to "1" and all the bits in the least significant level are set to "0" in response to a one call-unit add command given in the next place. Thus, the conventional call-unit count device performs a carry from a low-order level to a high-order level by inputting one call-unit add command after the transition of all the bits in the least significant level from a "0" state to a "1" state.

SUMMARY OF THE INVENTION

With the foregoing in view, it is an object of the present invention to provide a call-unit count device capable of storing large call units in a small-scale memory circuit or with the less rewritable able number of times.

It is, another object of the present invention to provide a call-unit count device capable of properly setting call units to be stored and storing them therein, even if it is deactivated during a carry process.

According to one aspect of the present invention, for achieving the above objects, there is provided a call-unit count device comprising:

memory means having a high-order level and a low-order level composed of n (n: integer greater than or equal to 2) bits, said memory means being activated such that all the bits indicative of the initial value and placed in the low-order level are changed to reversed values bit by bit each time a one call-unit add command is given, all the bits in the low-order level, which have been brought to the reversed values, are returned to the initial value bit by bit each time the one call-unit add command is given, and values stored in the high-order level are changed upon a carry from the low-order level to the high-order level.

BRIEF DESCRIPTION OF THE DRAWINGS

While the specification, concludes with claims particularly pointing out and distinctly claiming the subject matter

Figure 1:
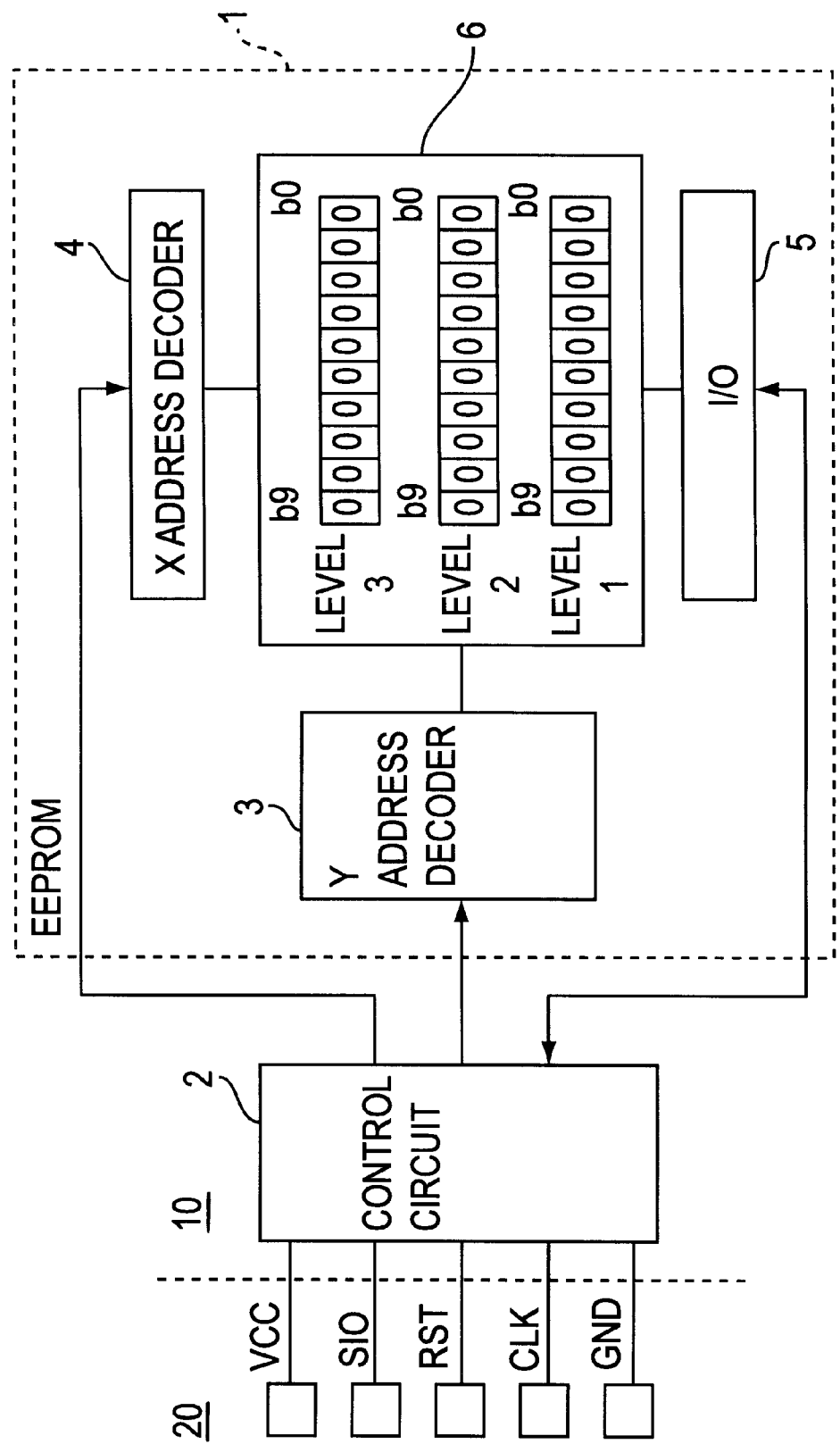
Figure 3:
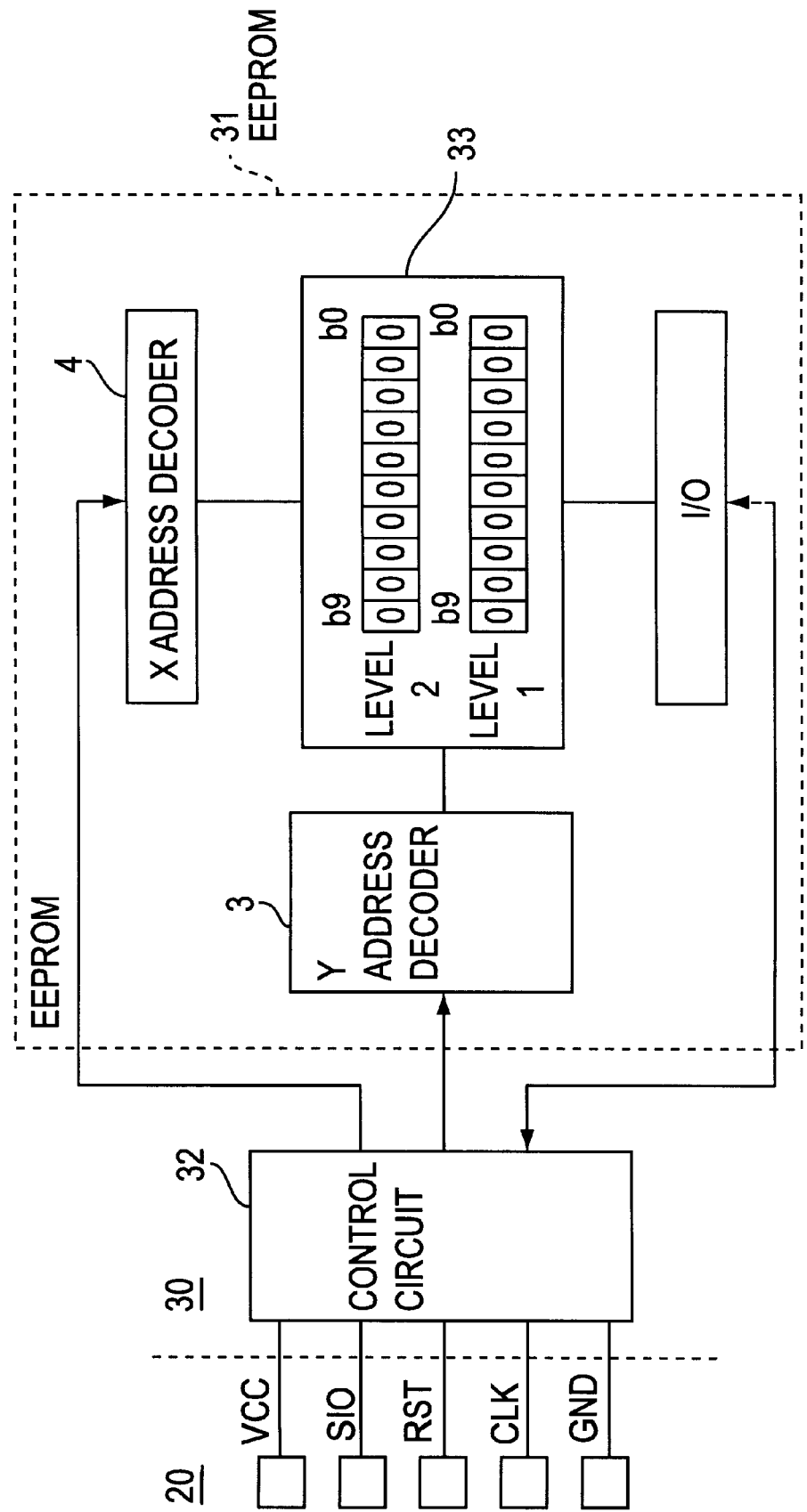
Figure 5:
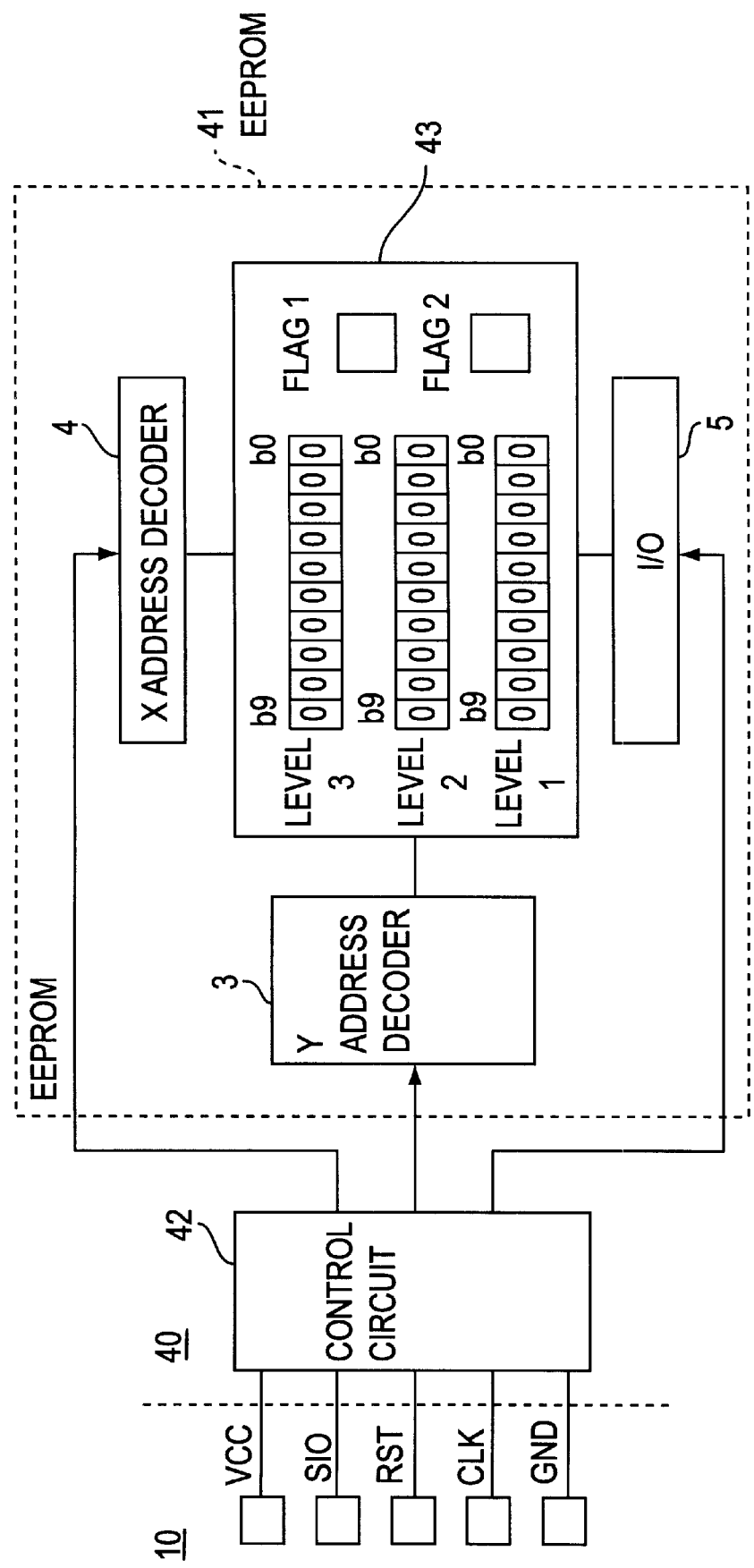
Figure 7:
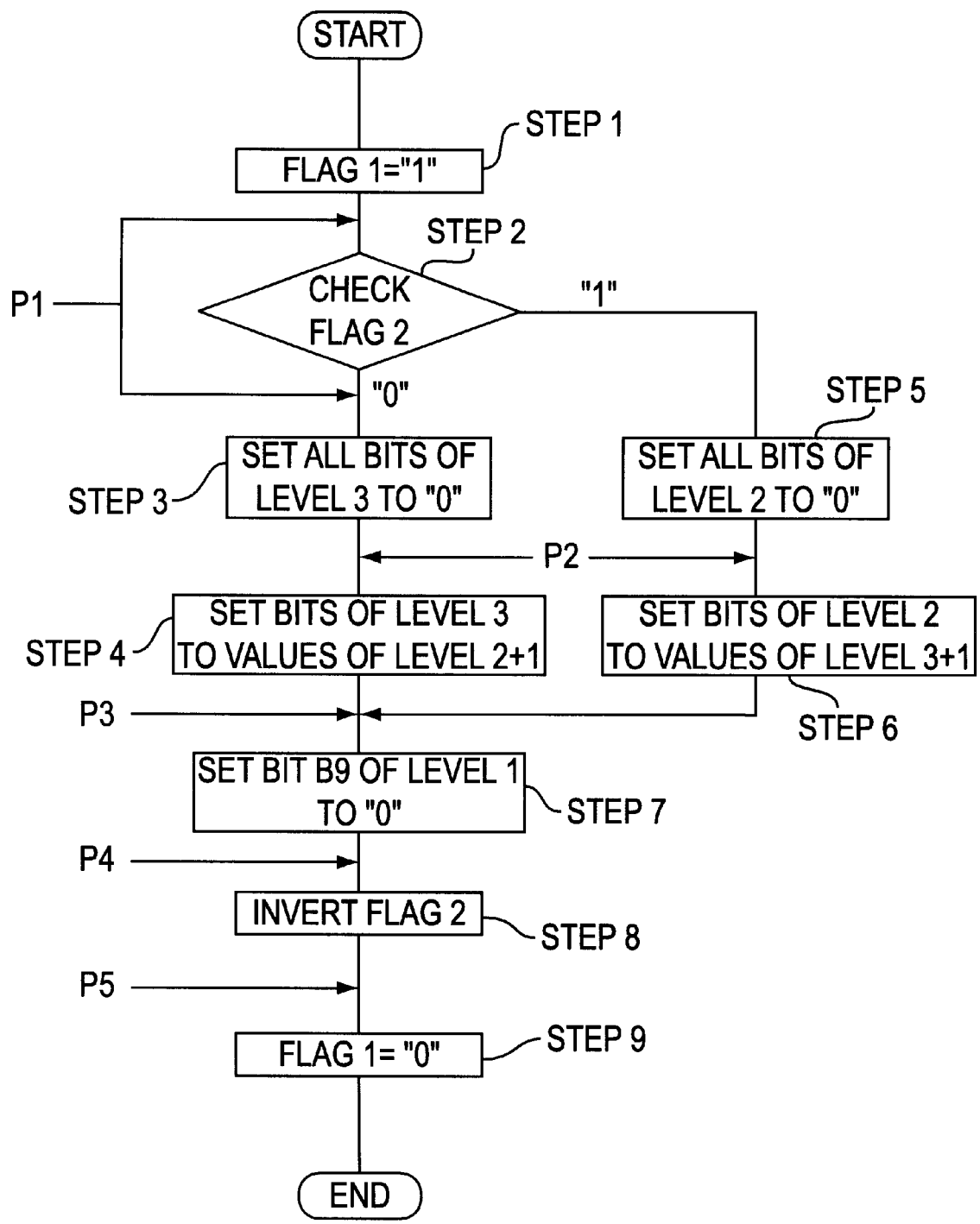

2 which is regarded as the invention, it is believed that the invention and the objects, features and advantages thereof will be better understood from the following description taken in connection with the accompanying drawings in which:

FIG. 1 is a schematic configurational view showing a first embodiment of the present invention;

FIG. 2 is a view for describing a call-unit count storing process employed in the first embodiment;

FIG. 3 is a schematic configurational view illustrating a second embodiment of the present invention;

FIG. 4 is a view for explaining a call-unit count storing process employed in the second embodiment;

FIG. 5 is a schematic configurational view showing a third embodiment of the present invention;

FIG. 6 is a view for describing a call-unit count storing process employed in the third embodiment;

FIG. 7 is a view for explaining a carry process employed in the third embodiment; and FIG. 8 is a view for describing states of an EEPROM at respective points at the time of the carry process employed in the third embodiment.

DETAILED DESCRIPTION OF THE PREFERRED EMBODIMENTS

FIG. 1 is a schematic configurational view of an IC card showing a first embodiment of a frequency or call-unit count device according to the present invention. An IC card 10 corresponding to a portable module shown in FIG. 1 has an EEPROM 1 and a control circuit 2. When the IC card 10 is inserted into a card reader 20 used as a fixed module, it adds a call unit given by a call-unit add command to the call units (corresponding to the sum of previous call units given by the call-unit add commands supplied to the IC card 10), which has been stored till then. The IC card 10 causes the EEPROM 1 to store the call units obtained by its addition therein. When the IC card 10 is disconnected from the card reader 20, the IC card 10 stops operating and stores and holds the resultant call units therein.

The IC card 10 and the card reader 20 are electrically connected to each other by a power line VCC for supplying power to the IC card 10, a ground line GND, a clock line CLK for supplying an operating clock to the IC card 10, a reset line RST for resetting the control circuit 2 of the IC card 10, and a serial data line SIO for transmitting a frequency or call-unit add command issued from the card reader 20 to the control circuit 2 and transferring the call units read from the EEPROM 1 to the card reader 20. The EEPROM 1 has a Y address decoder 3, an X address decoder 4, a control/data interface (I/O) 5 and a unit cell region 6. The EEPROM 1 is able to erase and write data therein in accordance with the designation of bits.

The unit cell region 6 has 30 bits (30 unit cells) and is divided into levels 1, 2 and 3 every 10 bits.

An electric charge is injected into a floating gate of each unit cell by erasing and is drawn or discharged therefrom by writing. In the following description, the initial value of a bit is associated with the written state, which is expressed as "0". Further, an inverted value of a bit is associated with the erased state, which is represented as "1". Alternatively, the initial value may be associated with the erased state and the inverted value may be associated with the written state.

The Y address decoder 3 and the X address decoder 4 specify or designate an erasing, writing or reading bit in accordance with address data sent from the control circuit 2.

The I/O 5 performs data writing, erasing or reading on the bit designated by the Y address decoder 3 and the X address decoder 4 in response to a write command (W), an erase command (E) or a read command (R) sent from the control circuit 2 and sends the read data (frequency or call unit) to the control circuit 2.

When the call-unit add command is inputted to the control circuit 2 from the card reader 20, the control circuit 2 sends address data and an erase/write command to the EEPROM 1 and causes the EEPROM 1 to execute a call-unit count storing process. Thus, the call unit to be stored in the EEPROM 1 is renewed. Incidentally, the control circuit 2 may be realized by hard means or by soft processing of a microprocessor.

FIG. 2 is a view for explaining the call-unit count storing process of the IC card shown in FIG. 1.

Figure 2A:
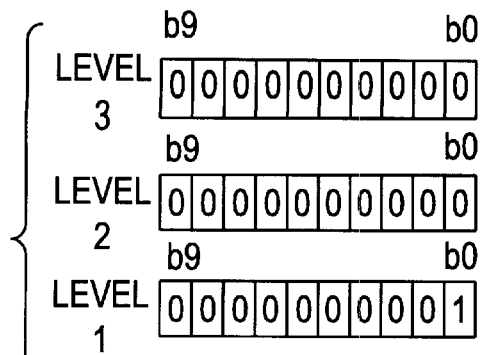
Figure 2B:
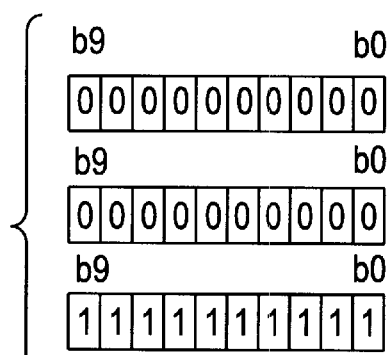
Figure 2C:
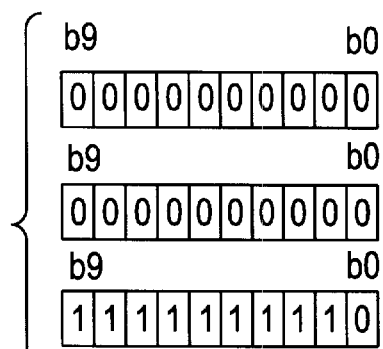

As shown in FIG. 2(a), bits for the level 1 are set to "1" bit by bit from a bits b0 each time a one call-unit add command is given. Thus, 1 to 10 call units are stored. When the one call-unit add command is given after all the bits in the level 1 have been brought to "1" (see 10 call units in FIG. 2(b)), the bit b0 in the level 1 is set to "0" (see 11 call units in FIG. 2(c)). Thereafter, the bits in the level 1, which are represented as "1", are set to "0" bit by bit each time one call-unit add command is given.

Figure 2D:
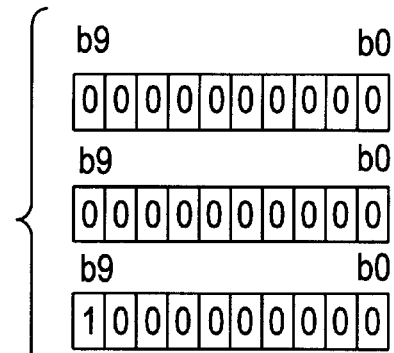
Figure 2E:
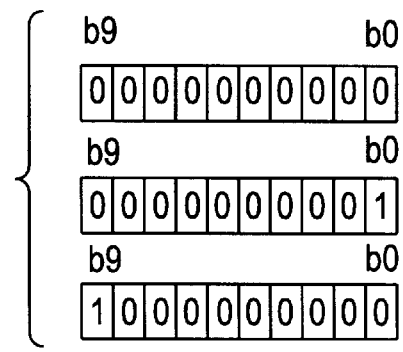
Figure 2F:
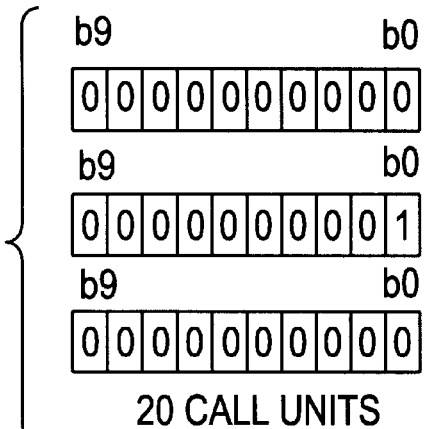

When a one call-unit add command is given after all the bits in the level 1 exclusive of the bit b9 have been brought to "0" (see 19 call units in FIG. 2(d)), a bit b0 in the level 2 is set to "1" (see FIG. 2(e)) and the bit b9 in the level 1 is set to "0" (see 20 call units in FIG. 2(f)). Thus, a carry from the level 1 to the level 2 is executed. This process is called a "carry process".

At this time, the bits b0 through b9 in the level 1 are rewritten once when the one call-unit add command is given twenty times (erasing and writing are respectively performed once).

Next, the above process which sets all the bits in the level 1 represented as "0" to "1" bit by bit each time the one call-unit add command is given, and which then sets all the bits in the level 1 represented as "1" to "0" bit by bit each time the one call-unit add command is given after all the bits have been brought to "1", is repeated until the storage of 21 through 219 call units. Namely, a process for setting all the bits in the level 1 to "0" each time the one call-unit add command is given twenty times, is repeatedly executed. Bits represented as "0" in the level 2 are set to "1" bit by bit each time a one call-unit add command is given twenty times.

Figure 2G:
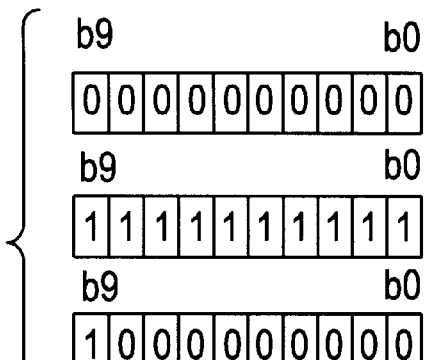
Figure 2H:
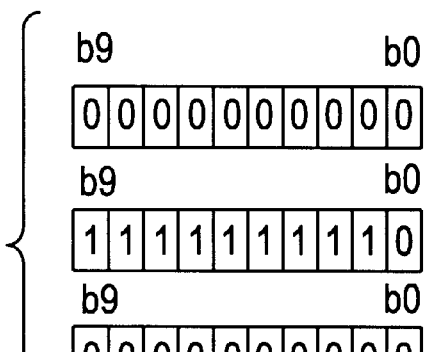

Next, all the bits in the level 2 and all the bits except for the bit b9 in the level 1 have been brought to "1" and "0" respectively (see 219 call units in FIG. 2(g)). Then, when the one call-unit add command is given, the bit b0 in the level 2 is set to "0" and the bit b9 in the level 1 is set to "0" (see 220 call units in FIG. 2(h)).

Next, the process for setting all the bits in the level 1 represented as "0" to "1" bit by bit each time the one call-unit add command is given and all the bits in the level 1 represented as "1" to "0" bit by bit each time the one call-unit add command is given after all the bits have been brought to "1",is repeated until storage of 221 through 399 call units. The bits in the level 2, which are represented as "1", are set to "0" bit by bit each time the one call-unit add command is given twenty times.

Next, all the bits exclusive of the bit b9 in the levels 1 and 2 have been brought to "0" (399 call units). Next, when the one call-unit add command is issued, a bit b0 in the level 3 is set to "1" and the bits 9 in the levels 1 and 2 are respectively set to "0" (400 call units). Thus, a carry from the level 2 to the level 3 is done. In the level 2, all the bits are set to "0" each time the one call-unit add command is given 400 times.

Next, the process for setting all the bits in the level 1 represented as "0" to "1" bit by bit each time the one call-unit add command is given and all the bits in the level 1 represented as "1" to "0" bit by bit each time the one call-unit add command is given after all the bits have been brought to "1",is repeated until the storage of 401 through 7999 call units. In the level 2, a process for setting all the bits represented as "0" to "1" bit by bit each time the one call-unit add command is given twenty times and setting all the bits represented as "1" to "0" bit by bit each time the one call-unit add command is given twenty times after all the bits have been brought to "1", is repeated. In the level 3, bits represented as "0" therein are set to "1" bit by bit each time the one call-unit add command is given 400 times. After all the bits in the level 3 have been brought to "1", bits represented as "1" in the level 3 are set to "0" bit by bit each time the one call-unit add command is given 400 times.

Figure 2I:
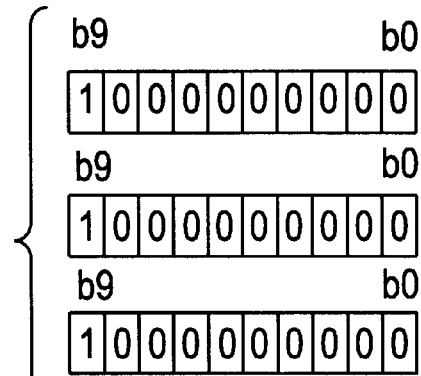
Figure 2J:
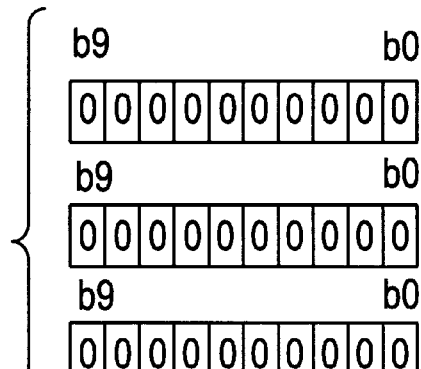

Next, all the bits exclusive of the bits b9 in the levels 1 through 3 are set to "0" (see 7999 call units in FIG. 2(i)). Next, when the one call-unit add command is given, all the bits in the levels 1 through 3 are set to "0" (see 8000 call units in FIG. 2(j)).

At this time, the bits b0 through b9 in the level 1 correspond to the bits that the number of times that they are renewed, reaches the maximum. The number of times that they are rewritten, becomes 400.

According to the first embodiment, the carry from the level 1 to the level 2 is carried out each time the one call-unit is given 2n times (where n is the number of bits in the level 1, and is equal to 10 in the present embodiment). It is thus possible to store large frequencies or call units in a small-scale memory circuit or with the less rewritable number of times. It is also possible to reduce the probability that call-unit misstoring occurs due to the deactivation of the present device during the carry process.

Incidentally, the order of effecting erasing and writing on the levels 1 through 3 is not necessarily limited to the transition of the low-order bits to the high-order bits. Further, the configurational number of bits in the levels 1 through 3 are not limited to 10 respectively. The levels 1 through 3 may be set so as to become different in configurational number of bits.

The portable module is by no means limited to a card form. Further, the control circuit 2 may be incorporated into the fixed module.

The first embodiment has described the case in which the call-unit count storing process is executed when the one call-unit add command is given. However, the above-described process is carried out according to the given call units even if a one or more call-units add command is given. When, for example, a one call-unit is already stored and a command for adding 3 call units to it is issued, the bits b1 through b3 in the level 1 are respectively set to "1". When 19 call units are already stored and a command for adding 2 call units to it is issued, the bit b0 in the level 2 is set to "1", the bit b0 in the level 1 is set to "1" and the bits b1 through b9 in the level 1 are respectively set to "0".

FIG. 3 is a schematic configurational view of an IC card showing a second embodiment of a call-unit count device according to the present invention. An IC card 30 shown in FIG. 3 has an EEPROM 31 and a control circuit 32.

When the IC card 30 is a inserted into a card reader 20, it adds a call unit given by a call-unit add command to the call units (corresponding to the sum of previous call units given by the call-unit add commands issued to the IC card 30), which has been stored up to now. Thereafter, the IC card 30 causes the EEPROM 31 to store the call units obtained by its addition. When the IC card 30 is withdrawn from the card reader 20, the IC card 30 stops operating and holds the resultant call units therein.

The EEPROM 31 is one formed by replacing the unit cell region 6 of the EEPROM 1 shown in FIG. 1 with a unit cell region 33 having 10-bit levels 1 and 2.

The control circuit 32 causes the EEPROM 31 to execute a call-unit count storing process according to the call-unit add command. Incidentally, the control circuit 32 may be realized by hard means or soft processing of a microprocessor.

FIG. 4 is a view for describing the call-unit count storing process employed in the second embodiment of the present invention.

Bits in the level 1 are respectively set to "1" bit by bit from a bit b0 as shown in FIG. 4(a) each time a one call-unit add command is given. Thus, 1 to 10 call units are stored in the EEPROM 31. When the one call-unit add command is given after all the bits in the level 1 have been brought to "1" (10 call units), the bit b0 in the level 1 is set to "0" (see 11 call units in FIG. 4(b)). Next, the bits represented as "1" in the level 1 are respectively set to "0" bit by bit each time the one call-unit command is issued.

Next, when the one call-unit add command is provided after all the bits exclusive of the bit b9 in the level 1 have been brought to "0" (see 19 call units in FIG. 4(c)), values stored in the level 2 are rewritten into binary digits ("0000000001") obtained by adding +1 to binary digits ("0000000000") stored in the level 2 up to now from the binary digits ("0000000000") stored in the level 2. Namely, the bit b0 in the level 2 is set to "1" (see FIG. 4(d)) and the bit b9 in the level 1 is set to "0" (see 20 call units in FIG. 2(e)).

Subsequently, a process for setting all the bits represented as "0" in the level 1 to "1" bit by bit each time a one call-unit add command is issued and setting all the bits represented as "1" to "0" bit by bit each time the one call-unit add command is issued after all the bits have been brought to "1", is repeated. In the level 1, all the bits are returned or reset to "0" each time the one call-unit add command is given twenty times. In the level 2, the values stored in the level 2 are rewritten to the binary digits obtained by adding +1 to the stored binary digits each time the one call-unit add command is issued twenty times. Namely, the number of times that a carry from the level 1 to the level 2 is done, is written into the level 2 as data represented in the form of a binary number. At 20479 call units shown in FIG. 4(i), all the bits in the level 2 are set to "1" and all the bits other than the bit b9 in the level 1 are set to "0". When the one call-unit add command is thereafter issued, all the bits in the levels 1 and 2 are brought to "0" and the EEPROM 31 is returned to its initial state (see 20480 call units in FIG. 4(j)). At this time, the bits b0 through b9 in the level 1 are rewritten each time the one call-unit add command is given twenty times (writing and erasing respectively are performed once). In the case of the level 2, the least significant bit is rewritten the most times, namely each time the one call-unit add command is given 40 times.

A description will now be made of a call-unit count storing process executed when a command for simultaneously adding two or more call units is issued from the card reader 20.

When a command for adding one or more call units and less than 20 call units is given from the card reader 20, the above-described process is executed according to the given call units. When, for example, one call unit is already stored and a command for adding three call units thereto is issued, the bits b1 through b3 in the level 1 are respectively set to "1". Further, when 19 call units are already stored and a command for adding 2 call units thereto is issued, the bit b0 in the level 2 becomes "1", the bit b0 in the level 1 becomes "1" and the bits b1 through b9 in the level 1 become "0" respectively.

If a command for adding 20 or more call units at a time is issued from the card reader 20, then the control circuit 32 divides a given call unit C into C=20×A+B (where B is less than 20). Further, the control circuit 32 changes only the values stored in the level 2 A times with respect to the 20×A call units, without varying the bits in the level 1, and thereafter executes the same call-unit count storing process as when the one call-unit add command is given B times. When the call unit is given as 101(5×20+1), for example, the values stored in the level 2 alone are changed five times, and then the same process as when the one call-unit add command is given once is executed.

Thus, according to the second embodiment, all the bits in the level 1 are set to "0" each time a command for adding the 20 call units in total is issued. As a result, since the number of times that a carry from the level 1 to the level 2 is carried out is stored in a level 2 as the value represented in the form of the binary number, the number of times that the bits in the level 1 are renewed is reduced, and large numbers of call units can be stored in a small capacity. When a command for simultaneously adding more call units is issued, a processing time interval can be shortened by forcibly effecting the process of the level 2 alone on call units corresponding to an integral multiple of 20.

Incidentally, the order of effecting erasing and writing on the level 1 is not limited to the transition from a low-order bit to a high-order bit. Further, the configurational numbers of bits in the levels 1 and 2 are not necessarily limited to 10 bits respectively.

The portable module is not necessarily limited to the card. Further, the control circuit 32 may be provided within a fixed module.

FIG. 5 is a schematic configurational view of an IC card showing a third embodiment of a call-unit count device according to the present invention. An IC card 40 has an EEPROM 41 and a control circuit 42. When the IC card 40 is inserted into a card reader 10, it add a call unit given by a call-unit adds command to the call units (corresponding to the sum of previous call units given by the call-unit add commands issued to the IC card 40 from the card reader 10), which has been stored up to now. Further, the IC card 40 causes the EEPROM 41 to store the call-units obtained by its addition therein. When the IC card 40 is withdrawn from the card reader 10, it stops operating and stores and holds the resultant call units therein.

The EEPROM 41 is formed by replacing the unit cell region 6 of the EEPROM 1 shown in FIG. 1 with a unit cell region 43 having 10-bit levels 1 through 3, a one-bit flag 1 and a one-bit flag 2. Further, the level 1 is erasable/writable in accordance with the designation of each bit. The levels 2 and 3 are erasable/writable in accordance with the designation of each word.

The level 1 is a low-order level. In a manner similar to the first or second embodiment, a process for setting all the bits represented as "0" in the level 1 to "1" bit by bit each time a one call-unit add command is issued and setting all the bits represented as "1" to "0" bit by bit each time the one call-unit add command is issued after all the bits have been brought to "1", is repeated. Further, the levels 2 and 3 are both high-order levels and are made effective in alternate order. The flag 1 indicates whether or not the level is under carry processing. The flag 1 is set to "1" during carry processing and is set to "0" otherwise. The flag 2 indicates whether or not either one of the levels 2 and 3 is effective. When the level 2 is valid or effective, for example, the flag 2 is brought to "0". On the other hand, when the level 3 is valid, the flag 2 is set to "1". The control circuit 42 causes the EEPROM 41 to execute a call-unit count storing process according to the call-unit add command. Further, when the control circuit 42 is deactivated during carry processing, the control circuit 42 executes a process for restoring the carry process upon the next startup. Incidentally, the control circuit 42 may be realized by hard means or soft processing of a microprocessor.

FIG. 6 is a view for explaining the call-unit count storing process employed in the third embodiment of the present invention.

The call-unit count storing process employed in the third embodiment is as follows: Values, which are indicative of the number of times that a carry from the level 1 to the high-order level is executed, and which are represented in binary form, are alternately stored in the levels 2 and 3 for each carry process, and the flag 2 is reversed for each carry process.

FIG. 6(a) indicates that the stored call units is "1". Further, FIG. 6(a) also shows that the flag 2 is "0" and the level 2 is valid. Upon a carry process in which values stored in the high-order level are varied upon transition from 19 call units to 20 call units, values stored in the level 3 are set to stored values (0000000001) obtained by adding 1 to the values (0000000000) stored in the level 2 defined as valid by the flag 2. Further, the flag 2 is reversed so as to reach "1". In the case of 20 call units shown in FIG. 6(b), a level 3 is made valid. Similarly, upon a carry process in which values stored in the high-order level are varied upon transition from 39 call units to 40 call units, values stored in a level 2 are set to values (0000000010) obtained by adding 1 to values (0000000001) stored in the level 3 defined as valid by a flag 2. Further, the flag 2 is reversed again so as to reach "0".

Level 2 is made valid in the case of 40 call units shown in FIG. 6(c). In order to read the call units stored in the EEPROM 41, the valid high-order level is selected according to the value of the flag 2, and the call units are read from the high-order level defined as valid by the flag 2 and the level 1.

FIG. 7 is a flowchart for describing a procedure for executing the carry process employed in the third embodiment of the present invention. In Step 1, the flag 1 is set to "1". In Step 2, the position or state of the flag 2 is checked. If the flag 2 is represented as "0", then all the bits in the level 3 are respectively set to "0" in Step 3. Further, the values stored in the level 3 are set to the values obtained by adding 1 to the values stored in the level 2 in Step 4. If the flag 2 is found to be "1" in Step 2, then all the bits in the level 2 are respectively set to "0" in Step 5. In Step 6, the values stored in the level 2 are set to the values obtained by adding 1 to the values stored in the level 3. Next, the routine step proceeds to Step S7 where the bit b9 in the level 1 is set to "0" and all the bits in the level 1 are respectively set to "0". Next, the flag 2 is reversed in Step 8. In Step 9, the flag 1 is set to "0". As a result, the carry process is terminated.

A restoring process for storing the proper call units in the IC card 40 when a power failure, a card withdrawal, etc., occurs during the carry process and the IC card 40 is deactivated and thereafter started up, will now be described.

FIG. 8 is a view for describing states of the EEPROM 41 at respective points (P1 through P5) on the carry process shown in FIG. 7 and shows a process for performing a carry from 59 call units to 60 call units. Whether or not the IC card is deactivated due to occurrence of the card withdrawal during the carry process is determined upon its startup depending on whether the flag 1 is "1". Namely, since it is judged or determined that the interruption of the carry process has occurred when the flag 1 is "1", the following restoring process is executed. When the flag 1 is "0", the normal call-unit count storing process is executed.

A description will first be made of a case in which the flag 1 is "1" and all the bits in the level 1 are not "0" (correspond to P1 through P3 shown in FIGS. 7 and 8). In this case, the value of a high-order level undefined by the flag 2 is replaced by a value obtained by adding +1 to the value of the high-order level defined by the flag 2 (level 2 if the flag is "0" or level 3 if the flag is "1"). Further, all the bits in the level 1 are respectively set to "0", the flag 2 is reversed and the flag 1 is set to "0". Thus, the proper call units to be stored are stored in the IC card.

Further, a description will be made of a case in which the flag 1 is "1" and all the bits in the level 1 are "0" (correspond to P4 through P5 shown in FIGS. 7 and 8). In this case, the value of the flag 2 is set so that either one of the levels 2 and 3, which is larger in value, is rendered valid. Further, the flag 1 is set to "0". Thus, the proper call units to be stored are stored in the IC card.

According to the third embodiment as described above, large call units can be stored with the less reloadable number of times and in less-bit configurations. Even if the power failure, the card withdrawal, etc., occurs during the carry process so that the IC card stops operating, this can be determined by the flag 1 upon the next startup. Further, the restoration of the IC card according to the states of the level 1 and the flag 2 can prevent misstoring of the call units due to the deactivation of the IC card during the carry process.

Incidentally, the order of effecting erasing and writing on the level 1 is not necessarily limited to the transition from the low-order bit to the high-order bit. Further, the configurational numbers of bits in the levels 1, 2 and 3 are not limited to 10 bits, respectively.

The portable module is by no means limited to a card form. Further, the control circuit 42 may be incorporated into a fixed module, or the control circuit for executing the call-unit count storing process may be incorporated into a portable module. Alternatively, the control circuit for executing the restoring process may be provided within a fixed module.

Moreover, the carry from the level 1 to the high-order level is done in base 2n (where n=10) but may be carried out in base n. Further, the levels 2 and 3 may be established in notations other than binary notation.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A call-unit count device comprising:

memory means having a high-order level and a low-order level composed of n bits, where n is an integer greater than or equal to 2, said memory means being activated such that:

(a) all the bits, each in an initial value and placed in the low-order level, are changed to reversed values bit by bit each time a one call-unit add command is given;

(b) once all the bits of the low-order level have been changed to reversed values, all the bits in the low-order level are returned to the initial value bit by bit each time the one call-unit add command is given; and (c) values stored in the high-order level are changed upon a carry from the low-order level to the high-order level, the carry indicating that all the bits in the low-order level have been changed to the reverse values and will thereafter be changed back to the initial values.

2. A call-unit count device according to claim 1, wherein said high-order level is composed of m bit, where m is a positive integer, and the stored values are values represented as a binary number.

3. A call-unit count device according to claim 1, wherein:

said memory means has a first level corresponding to the low-order level and second through $N^{th}$ levels, where N is an integer greater than or equal to 2, each corresponding to the high-order level and each composed of a plurality of bits; and said memory means is activated such that all of the bits, each indicative of the initial value and placed in the $k^{th}$ level, where k is an integer having a value from 2 to N, are changed to reversed values bit by bit each time a carry from a $(k-1)^{st}$ level to the $k^{th}$ level is carried out, and all bits in the $k^{th}$ level, which have been brought to the reversed values, are returned to the initial value bit by bit each time the carry from the $(k-1)^{st}$ level to the $k^{th}$ level is carried out.

4. A call-unit count device according to claim 1, wherein when a command for adding call units expressed in an equation of p×(2n)+q (where p: positive integer, and q: 0 or positive integer and integer smaller than 2n) is given, only the values stored in the high-order level are changed without changes in the bits in the low-order level upon addition of call units of p×(2n), and the bits in the low-order level or the bits in the high-order level and the low-order level are changed upon addition of call units of q.

5. A call-unit count device according to claim 1, wherein said memory means is a nonvolatile device provided within a portable module, and wherein when the portable module is inserted into a fixed module, said memory means is started, and when the portable module is disconnect from the fixed module, said memory means is deactivated.

6. A call-unit count device according to claim 1, wherein said memory means is composed of a plurality of unit cells provided within an EEPROM.

7. A call-unit count device comprising:

memory means comprising:

a low-order level;

a high-order level including a first high-order level and a second high-order level, said high-order level being provided such that values stored in either one of the first and second high-order levels are changed in response to a carry from the low-order level to the high-order level;

a first flag indicative of whether a carry process is under execution; and a second flag for specifying a valid one of the first and second high-order levels;

said memory means being activated such that when the carry from the low-order level to the high-order level occurs: (a) the first flag is set to a first value indicative of the carry process being under execution; (b) the values stored in the first or second high-order level, which have been unspecified by said second flag, are thereafter changed to values obtained by adding 1 to the values stored in the first or second high-order level, which have been specified by said second flag; (c) bits in the low-order level are respectively returned to the initial value, and said second flag is reversed; and thereafter, (d) said first flag is set to a second value indicative of a non-carry process being under execution.

8. A call-unit count device according to claim 7, wherein when said first flag is of the first value and all the bits in the low-order level are not of the initial value upon startup of said call-unit count device: (a) the values stored in the first or second high-order level, which have been unspecified by said second flag, are changed according to the values stored in the first or second high-order level, which have been specified by said second flag; (b) all the bits in the low-order level are respectively returned to the initial value; (c) said second flag is reversed; and (d) said first flag is set to the second value; and wherein when said first flag is of the first value and all the bits in the low-order level are respectively of the initial value upon the startup, said second flag is set so as to specify either one of the first and second levels, whichever has a larger value stored, and said first flag is set to the second value.

9. A call-unit count device according to claim 7, wherein said memory means is a nonvolatile device provided within a portable module, and wherein when the portable module is inserted into a fixed module, said memory means is started, and when the portable module is disconnected from the fixed module, said memory means is deactivated.

10. A call-unit count device according to claim 7, wherein said memory means is comprised of a plurality of unit cells provided within an EEPROM.

11. A method of operating a memory device for counting call-units, said memory device including a high-order level having n bits, where n is an integer greater than or equal to two, and a low-order level having m bits, where m is an integer greater than or equal to two, the method comprising the steps of:

(a) in response to a one call-unit add command, inverting a bit of the low-order level;

(b) repeating step (a) until all bits of the low-order level have been inverted;

(c) repeating step (a) until all bits of the low-order level have been re-inverted back to an initial value, except for a highest-order bit;

(d) in response to a one call-unit add command, following step (c), recording a carry condition generated by said low-order level in said high-order level; and (e) following step (d), inverting said highest-order bit of said low-order level.

12. A method according to claim 11, wherein said high-order level maintains a binary count of carry conditions.

13. A method according to claim 11, wherein said high-order level comprises K high-order sub-levels, 1, 2, . . . , K, where K is an integer greater than or equal to two and where 1 is the lowest sub-level and K is the highest sub-level, each having a number of bits $n_i$, where $n_i$ is an integer greater than or equal to two, $i=1, 2, \ldots, K$, and wherein an $i^{th}$ sub-level records a carry condition generated by an $(i-1)^{st}$ sub-level.

14. A method according to claim 13, wherein step (d) comprises the steps of: (d1) in response to a carry condition generated by said low-order level, inverting a bit of the sub-level 1; (d2) repeating step (d1) until all $n_1$ bits of sub-level 1 have been inverted; (d3) repeating step (d1) until all bits of sub-level 1 have been inverted back to their initial values, except for a highest-order bit; (d4) generating a sub-level 1 carry condition; and (d5) inverting the highest-order bit of sub-level 1.

15. A method according to claim 13, wherein an $i^{th}$ sub-level records a carry condition generated by an $(i-1)^{st}$ sub-level by the steps of: (1) in response to a carry condition generated by said $(i-1)^{st}$ sub-level, inverting a bit of the $i^{th}$ sub-level; (2) repeating step (1) until all $n_i$ bits of the $i^{th}$ sub-level have been inverted; (3) repeating step (1) until all bits of the $i^{th}$ sub-level have been inverted back to their initial values, except for a highest-order bit; (4) generating an $i^{th}$ sub-level carry condition; and (5) inverting the highest-order bit of the $i^{th}$ sub-level.

16. A method according to claim 13, wherein the carry conditions are recorded in the K sub-levels as binary numbers.

17. A method according to claim 11, wherein the high-order level comprises a first high-order level and a second high-order level, and wherein the memory device further includes a first flag and a second flag.

18. A method according to claim 17, wherein the first flag indicates the presence of a carry condition generated by said low-order level and said second flag indicates which one of the first high-order level and the second high-order level is designated as being valid and containing the present value of a count of carry conditions recorded in the high-order level.

19. A method according to claim 18, wherein step (d) further comprises the steps of: (d1) in response to a carry condition generated by the low-order level, setting the first flag; (d2) adding 1 to the valid one of the first high-order level and the second high-order level; (d3) storing the result in the one of the first high-order level and the second high-order level not designated as being valid by the second flag; (d4) inverting the second flag; and (d5) clearing the first flag.

20. A method according to claim 19, further comprising a start-up procedure comprising the steps of:

(f) when said first flag is set and all the bits in the low-order level are not at their initial values, performing the sub-steps of: (f1) changing the values stored in the one of the first and second high-order levels not designated as being valid by said second flag according to the values stored in the valid one of the high-order levels; (f2) setting all bits in the low-order level to their initial values; (f3) inverting said second flag; and (f4) clearing said first flag; and (g) when said first flag is set and all the bits in the low-order level are at their initial values, performing the sub-steps of: (g1) setting the second flag to designate as valid that one of the first high-order level and the second high-order level containing the larger value; and (g2) clearing said first flag.

\* \* \* \* \*